United States Patent
Wang et al.

(10) Patent No.: US 8,445,296 B2
(45) Date of Patent: May 21, 2013

(54) APPARATUS AND METHODS FOR END POINT DETERMINATION IN REACTIVE ION ETCHING

(75) Inventors: Chien Rhone Wang, Hsin-Chu (TW); Tzu-Cheng Lin, Hsin-Chu (TW); Yu-Jen Cheng, Hsin-Chu (TW); Chih-Wei Lai, Hsin-Chu (TW); Hung-Pin Chang, Taipei (TW); Tsang-Jiuh Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 33 days.

(21) Appl. No.: 13/189,287

(22) Filed: Jul. 22, 2011

(65) Prior Publication Data

US 2013/0023065 A1 Jan. 24, 2013

(51) Int. Cl.
*H01L 21/02* (2006.01)

(52) U.S. Cl.
USPC ...... 438/14; 438/5; 438/9; 438/712; 438/723; 257/E21.002; 257/E21.252; 257/E21.521; 257/E21.528; 257/E21.529

(58) Field of Classification Search
USPC .............. 438/5, 9, 14–17, 712, 714, 723; 257/E21.002, 252, 521–529
See application file for complete search history.

(56) References Cited

U.S. PATENT DOCUMENTS

| 4,877,757 A | * | 10/1989 | York et al. ............ 438/767 |
| 5,021,121 A | * | 6/1991 | Groechel et al. ............ 438/712 |
| 5,391,917 A | | 2/1995 | Gilmour et al. |
| 5,392,124 A | * | 2/1995 | Barbee et al. ............ 356/632 |
| 5,510,298 A | | 4/1996 | Redwine |
| 5,767,001 A | | 6/1998 | Bertagnolli et al. |
| 5,998,292 A | | 12/1999 | Black et al. |
| 6,184,060 B1 | | 2/2001 | Siniaguine |
| 6,322,903 B1 | | 11/2001 | Siniaguine et al. |
| 6,448,168 B1 | | 9/2002 | Rao et al. |
| 6,465,892 B1 | | 10/2002 | Suga |
| 6,472,293 B1 | | 10/2002 | Suga |
| 6,538,333 B2 | | 3/2003 | Kong |
| 6,599,778 B2 | | 7/2003 | Pogge et al. |
| 6,639,303 B2 | | 10/2003 | Siniaguine |
| 6,664,129 B2 | | 12/2003 | Siniaguine |
| 6,693,361 B1 | | 2/2004 | Siniaguine et al. |
| 6,740,582 B2 | | 5/2004 | Siniaguine |
| 6,800,930 B2 | | 10/2004 | Jackson et al. |
| 6,841,883 B1 | | 1/2005 | Farnworth et al. |
| 6,882,030 B2 | | 4/2005 | Siniaguine |
| 6,924,551 B2 | | 8/2005 | Rumer et al. |
| 6,962,867 B2 | | 11/2005 | Jackson et al. |
| 6,962,872 B2 | | 11/2005 | Chudzik et al. |

(Continued)

*Primary Examiner* — Michael Lebentritt
(74) *Attorney, Agent, or Firm* — Slater & Matsil, L.L.P.

(57) ABSTRACT

Methods and apparatus for performing end point determination. A method includes receiving a wafer into an etch tool chamber for performing an RIE etch; beginning the RIE etch to form vias in the wafer; receiving in-situ measurements of one or more physical parameters of the etch tool chamber that are correlated to the RIE etch process; providing a virtual metrology model for the RIE etch in the chamber; inputting the received in-situ measurements to the virtual metrology model for the RIE etch in the chamber; executing the virtual metrology model to estimate the current via depth; comparing the estimated current via depth to a target depth; and when the comparing indicates the current via depth is within a predetermined threshold of the target depth; outputting a stop signal. An apparatus for use with the method embodiment is disclosed.

15 Claims, 4 Drawing Sheets

U.S. PATENT DOCUMENTS

| | | |
|---|---|---|
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 8,010,222 B2 * | 8/2011 | Lehman et al. ............... 700/121 |
| 8,173,451 B1 * | 5/2012 | Tian et al. ...................... 438/14 |
| 8,193,007 B1 * | 6/2012 | Madriaga et al. ............... 438/14 |
| 8,285,414 B2 * | 10/2012 | Aharoni et al. ................ 700/175 |
| 2008/0047579 A1 * | 2/2008 | Ji et al. .......................... 134/1.1 |
| 2008/0207089 A1 * | 8/2008 | Lehman et al. ................... 451/6 |

* cited by examiner

APPARATUS AND METHODS FOR END POINT DETERMINATION IN REACTIVE ION ETCHING

BACKGROUND

A common requirement of current integrated circuit manufacturing and packaging is the use of interposers to receive single or multiple integrated circuit dies. The use of through vias or through substrate vias ("TSVs") extending through the interposers is increasing. These through vias allow electrical coupling between integrated circuit dies and components mounted on one side of an interposer, and terminals such as solder balls mounted on the opposite side of the interposer. Further, the use of TSV technologies with silicon interposer substrates enable wafer level processing ("WLP") of the interposer assemblies. This technique is increasingly applicable to increasing memory or storage device density, for example, without added circuit board area. As demand for hand held and portable devices such as smart phones and tablet computers increases, board area and board size restrictions also increases, and the use of the interposer assemblies and TSVs can meet these requirements. Vertically stacking of components using TSV technologies is referred to as "3DIC" and is increasingly used in developing advanced integrated systems.

During processing of the interposer, a typical approach is to perform a reactive ion etch ("RIE") process on a wafer. Often the wafer is a silicon wafer with, or without, active devices formed on it, and the etch process forms TSVs. The TSVs are very deep when compared to vias and contacts used in the conventional semiconductor processing for metal interconnection, for example. Also, the TSVs are typically formed into and through silicon or semiconductor substrates, while traditional vias and contacts are formed in dielectric materials such as nitrides, oxides, and the like. The use of wafers as an interposer enables wafer level processing ("WLP") of 3DIC structures which may include flip chip or wire bonded mounted integrated circuits on one side of the interposer, and solder ball or solder column connections on the back side for board level connections; this approach may be combined with a wafer dicing step performed late in the process, to form multiple 3DIC assemblies on a single wafer substrate prior to separating the assemblies.

Because of the high aspect ratios of the deep via holes formed using RIE processes for TSVs on wafers, additional techniques have been developed called deep RIE or "DRIE". The DRIE process is performed in a machine tool that includes a wafer handling system, a wafer station or platen within a vacuum chamber, reactive gas inlets, and electrodes for coupling an RF energy source. A wafer is processed by placing the wafer on a platen in the chamber, creating a vacuum, introducing certain gases, and initiating a plasma using the RF energy. Ions are accelerated and bombarded against the wafer. In DRIE chemical etching may be combined with physical bombardment of ion etching to further increase the etch rate achieved. Patterning is performed using masks over the wafer and photolithography is performed to define the via locations. The ions etch and sputter away the silicon in the exposed regions to form the vias. The vias are typically formed as "blind" vias from one side of the wafer, typically the DRIE etch is done from the "top" or "die side" of the wafer. After many processing steps this wafer will become the substrate or 3DIC interposer. Once the vias are etched by the DRIE process, the TSVs are then processed in an electroless or electroplating process to fill the vias with conductive material, typically copper. Later the backside of the wafer is partially removed in a thinning step, using chemical and mechanical grinding processes, to expose the bottom of the vias and thus complete the TSVs which extend through the interposer wafer.

The TSVs are essentially high aspect ratio, vertical holes. To achieve this profile, the use of a highly anisotropic process is needed. The DRIE process uses two alternating operations, an RIE etch, and deposition of an inert passivation layer. By alternatively etching and depositing, the via holes can be made deeper while the via sides remain vertical due to the presence of the protective passivation material. These etch and deposition processes are alternatively performed until the deep through via holes are completed. These vias may be up to 100 microns or more deep, and thus, the aspect ratio of the vias may be greater than or equal to 20:1 for example.

In order to control this TSV etch process, known methods typically process monitor or test wafers and observe the resulting via depths against a processing time. A recipe is developed that compares the depth of the TSVs in the monitor wafers to the time of DRIE etching, and a selected time is chosen.

However the use of the monitor wafer as an RIE etch endpoint determination is not accurate. Significant yield problems have been observed due to lot-to-lot, run-to-run, and even wafer-to-wafer variations in the resulting TSV depths. Some of these variations may be addressed by rework, adding cost to the interposer and the 3DIC process, other variations in TSV depth may be so great as to cause scrapped wafers. These problems lower yield, increase costs, and increase production time resulting in lowered throughput.

A continuing need thus exists for methods and systems to efficiently perform RIE etching with a reliable endpoint detection to achieve robust and uniform TSV depths, without the problems and costs experienced when using the known methods.

BRIEF DESCRIPTION OF THE FIGURES

For a more complete understanding of the present embodiments, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments or the claims.

Embodiments of the present application which are now described in detail provide novel methods and apparatus embodiments for performing reliable endpoint detection during a wafer process. In an example RIE etch process for forming TSVs, use of the embodiments provide substantial reduction in wafer-to-wafer, run-to-run, and lot-to-lot variations in TSV depths.

The methods are not limited to TSV or RIE etch processes and may be used for controlling other processes in semiconductor wafer processing, for example. By providing methods and apparatus to perform wafer processing for processes where simple physical observation for endpoint detection is not possible, wafer operations such as TSV etch can be effectively performed with highly reliable results. The loss of interposers and costly rework that presently occurs using prior known methods is reduced or eliminated, yield is increased and accordingly, the unit costs are lowered.

In order to illustrate the embodiments and their operation, example TSV etch process steps are first described. These are simplified and illustrative only and do not limit the embodiments or the scope of the claims, and these examples are presented for explanation and understanding of the embodiments. The methods may be extended to other etch processes, other processes for wafers, and other processes where end point detection using observation or simple physical means is not available.

Figure 1:
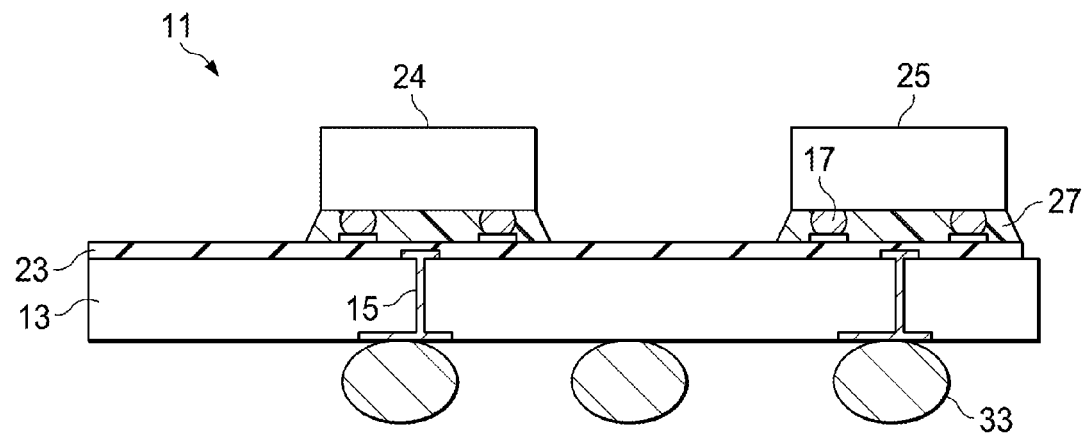
FIG. 1 depicts in a cross-sectional view an interposer substrate with TSVs to which the embodiments can be applied.

FIG. 1 depicts in a cross-section an example interposer assembly 11. In FIG. 1, substrate 13 is depicted. This substrate may be a silicon wafer, a semiconductor substrate, or another substrate material for interposers. Typically, silicon wafers are used in a wafer level processing ("WLP") approach. The substrate 13 has a die side, here shown as the upper side, and an opposite side (here shown as the bottom side) for receiving solder ball or bump connections for system connection, as is described later.

Through substrate vias ("TSVs") 15 are shown extending vertically through the substrate 13 from the die side of the substrate. These are formed as "blind vias" using photolithography, developing, patterning, RIE etching, and electroplating steps. For example, after the etch process, the TSVs may be completed using copper or another conductor material electroplated into the vias. Barrier layers and seed layers may be used.

A passivation layer 23 is formed over the substrate 13. Connectors 17 are formed over the passivation layer 23. The connectors 17 may be microbumps or bump connections. The connectors 17 may be formed of solder including lead based solder or lead free solder, typically eutectic materials such as SnAgCu ("SAC") may be used for lead free applications. These materials form a compound with a melting point compatible with solder reflow steps, as are known in the art. Integrated circuit dies ("ICs") 24 and 25 are shown mounted to the connectors 17 on the die side of the substrate 13. Note that these ICs may be of different types and may therefore have different thicknesses, as shown in the figure. However, this is only one example and ICs 24 and 25 can be of the same type, and have the same thickness, as well. An underfill 27 is applied after the ICs are mounted in a solder reflow operation that melts the microbumps to form a physical and electrical connection to the substrate 13. The underfill 27 protects the connectors 17 during processing and in the system, during thermal stress. The ICs 24 and 25 may be coupled one to another electrically though interconnect on the die side of the substrate 13, to form a system, although this is not necessary in all applications where the embodiments are used.

FIG. 1 also shows the interposer assembly 11 following a backgrinding process to thin the substrate 13 and complete the TSVs 15, and after a solder bumping or solder ball step. C4 solder bumps or solder balls 33 may be formed on the opposite or connection side of the substrate 13. The C4 solder bumps 33 are then used to make the external or system connections when the interposer assembly 11 is mounted to a circuit board or card. The backgrinding operation exposes the bottom of the TSVs 15 and completes them as vertical through connections.

Figure 2:
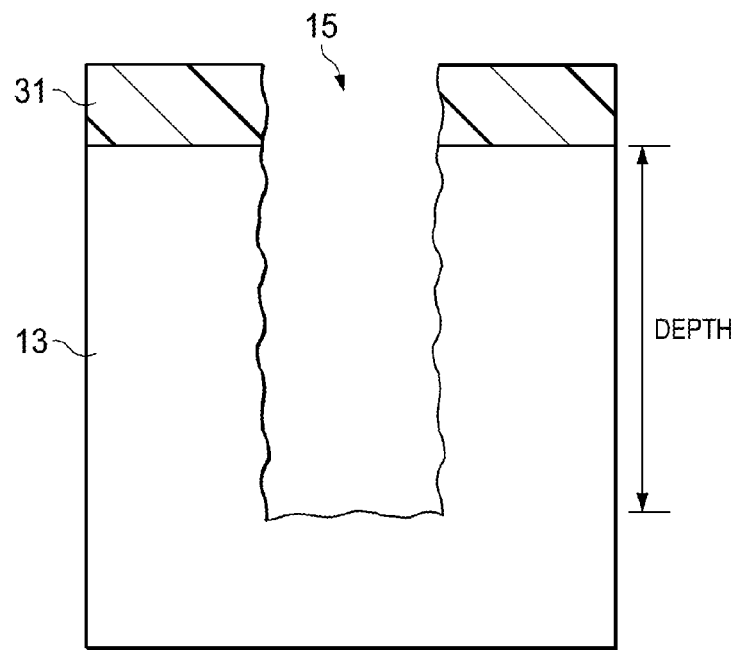
FIG. 2 depicts in a cross-sectional view a through silicon via to which the embodiments can be applied.

FIG. 2 depicts in a cross-section an embodiment TSV 15 at an intermediate processing step during the RIE etch process. Substrate 13 is shown in cross-section and has a mask 31 overlying the die side surface, with a pattern defining areas for vias. Via 15 is shown partially formed. As shown, the via depth is measured from the surface of the substrate to the bottom of the via hole. During the RIE etch, this depth will increase with processing time. As described above, the prior approach to controlling the depth of the via is to form vias using monitor wafers and using different etch recipes, primarily based on process time. The recipe is selected based on the results observed for the monitor wafers. Then, the vias are etched using the recipe selected. Time is used as the method for determining when to stop the etch process; that is, there is no end point detection using measurements or in-situ observations. The etch is stopped when sufficient time has elapsed, according to the recipe selected.

Figure 3:
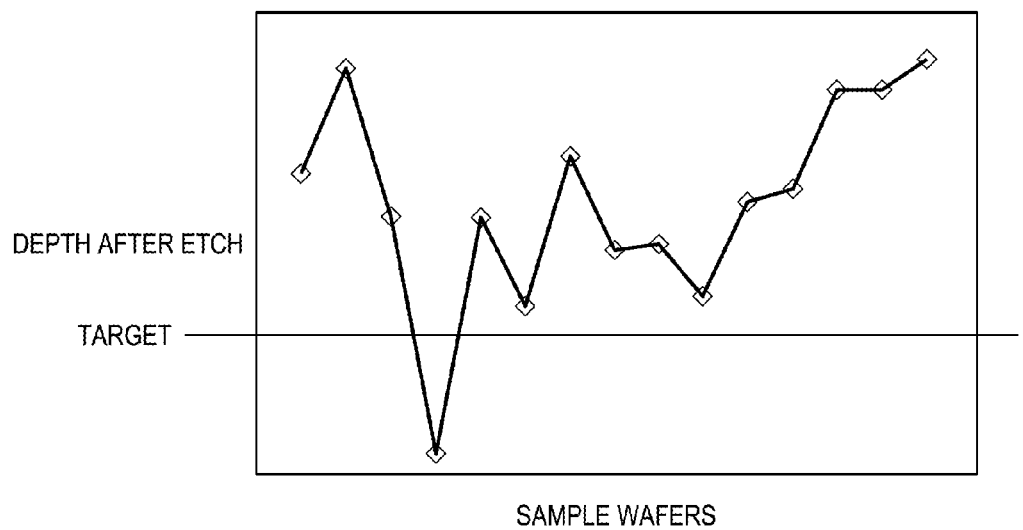
FIG. 3 depicts in a graph the variations observed for via depths using RIE etching.

FIG. 3 depicts a graph of TSV depths obtained using the conventional etch control approach for a plurality of wafers. The variation in via depth between the wafers is substantial; here, the target via depth is shown by the line labeled "Target" in the graph. The variation in depth from wafer-to-wafer observed was 1.3 microns, while the lot-to-lot variation observed was 2.0 microns, for a recipe having a 56 micron target depth.

A method embodiment is now described in the context of a novel method for controlling an RIE etch process. However, the method may be used to control other processes and is not limited to the example application.

In the example method embodiment, a virtual metrology model is developed for an RIE etch process. In a first step, a number of wafer runs are made in the process tool. The number of runs can vary but may range from 1-200 or more, for example. Real time in-situ process parameters are collected during these process runs. The via depth achieved in the process runs is also measured after the RIE etch process. Using statistical modeling, a virtual metrology model is developed. This model will output an estimated via depth based on the cycle time and the additional real time in-situ process parameter information that is collected. Using statistical analysis techniques and the physical parameter information, a virtual metrology model is formed that predicts the via depths.

Once the virtual metrology model is complete, it is then used to control subsequent wafer runs using the same process and tool. A wafer is introduced into the process chamber of the RIE tool, and RIE etching begins. The virtual metrology model is executed, for example using a computer that is part of the tool, or alternatively, using a separate computer or processor, and the model receives real time in-situ process parameters from the process tool. The model may be stored in a non-transitory computer readable medium, such as memory, or a hard drive, CD, DVD, disk, flash card, or the like, and may comprise software instructions that when executed by a computer or processor, implement the virtual metrology model.

The estimated via depth is then calculated by using the virtual metrology model. Using the estimated via depth, a comparison is made between the estimated depth and a target depth for the wafer. If the estimated depth is within a predetermined threshold of the target depth, a stop signal is indicated to the process tool and the RIE etch process is stopped.

The model may be a hybrid statistical model. The process parameters used may vary with the process tool equipment but may include, as non-limiting examples, the cycle time, the upper chamber temperature, the ESC temperature, the RF intermittent frequency for the tool, the RF frequency constant for the tool, and if needed, other constants that are determined during the modeling process. Fourier transforms may be used to form the model.

Equation 1 is one example model that was developed for a particular RIE etch tool, and is shown only for illustration:

$$Y=0.0133x_1+0.1455x_2+0.0694x_3-0297x_4+\ldots+\in$$

Where Y is the estimated depth, $x_1$ is Cycles, $x_2$ is the upper chamber temperature, $x_3$ is another chamber temperature, $x_4$ is the TCP RF frequency interval and other terms as needed, indicated by $\in$.

Thus, during the RIE etch process, the estimated via depth Y can be repeatedly calculated by using the virtual metrology model using the real time, in-situ process parameters, and when the estimated depth is within a threshold of the target depth, a stop signal can be generated and sent to the process tool.

In another embodiment, the RIE etch is performed until the estimated depth of the virtual metrology model is within a threshold of the target depth for the vias, and then, the RIE etch is stopped. An over etch is then performed in-situ in the same RIE etch tool. The over etch has a much reduced etch rate, and is used to improve the shape and profile of the TSV vias. This step is an optional, additional step and forms an additional alternative method embodiment.

Figure 4:
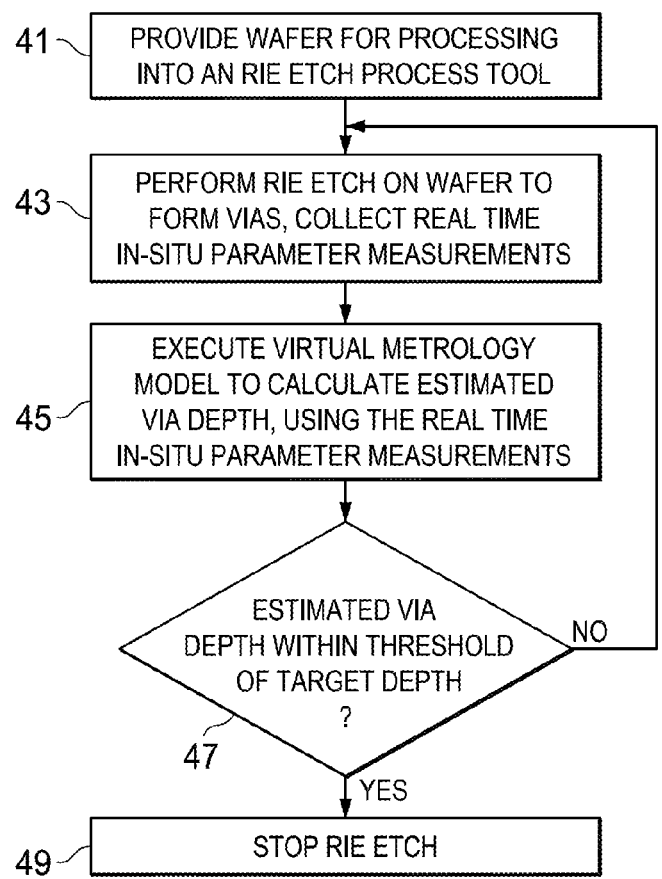
FIG. 4 depicts in a flow diagram a method embodiment.

FIG. 4 depicts an embodiment method in a flow chart form. In FIG. 4, a first step 41 begins with the wafer placed in a chamber of a RIE process tool, for example. In step 43, the RIE etch begins (or continues) while real time in-situ parameter measurements are collected from the tool. At step 45, a previously determined virtual metrology model is used to calculate an estimated via depth for the current wafer being processed in the tool, based on the parameters collected including the number of cycles performed thus far. At step 47, a decision is made, and if the estimated via depth is approximately equal to (that is, the estimated via depth is within a predetermined threshold of) a target via depth for the wafer, the method transitions to step 49, and a stop signal is sent to the RIE process tool to stop the RIE etching.

However, if at step 47 the estimated via depth is not within the threshold of the target depth, then the processing continues and the method returns to step 43, new real time in-situ parameter measurements are collected, the virtual model is executed to calculate the estimated via depth at step 45, an again the comparison is made at step 47; the method continues in this iterative fashion, until the target via depth is reached.

Figure 5:
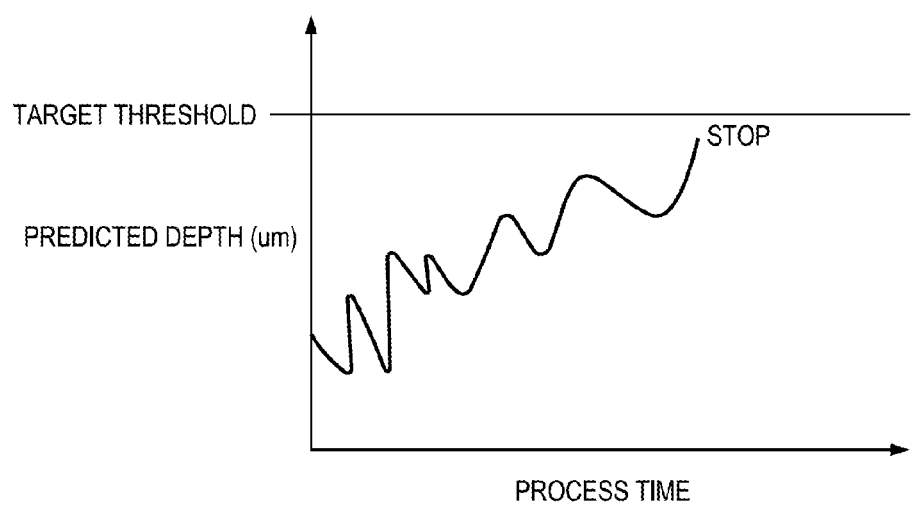
FIG. 5 depicts in a graph via depth predicted by an embodiment.

FIG. 5 depicts in a graph the operation of the virtual metrology model. The estimated via depth for an example RIE process is plotted on the vertical axis, versus the RIE process time elapsed plotted on the horizontal axis. As can be seen from the graph, the predicted depth is not a linear function and the virtual metrology model shows substantial non-linear response as time increases, until finally the target threshold (estimated depth of the vias is within a threshold of, that is approximately equals, the target depth), where the STOP signal is generated.

Figure 6:
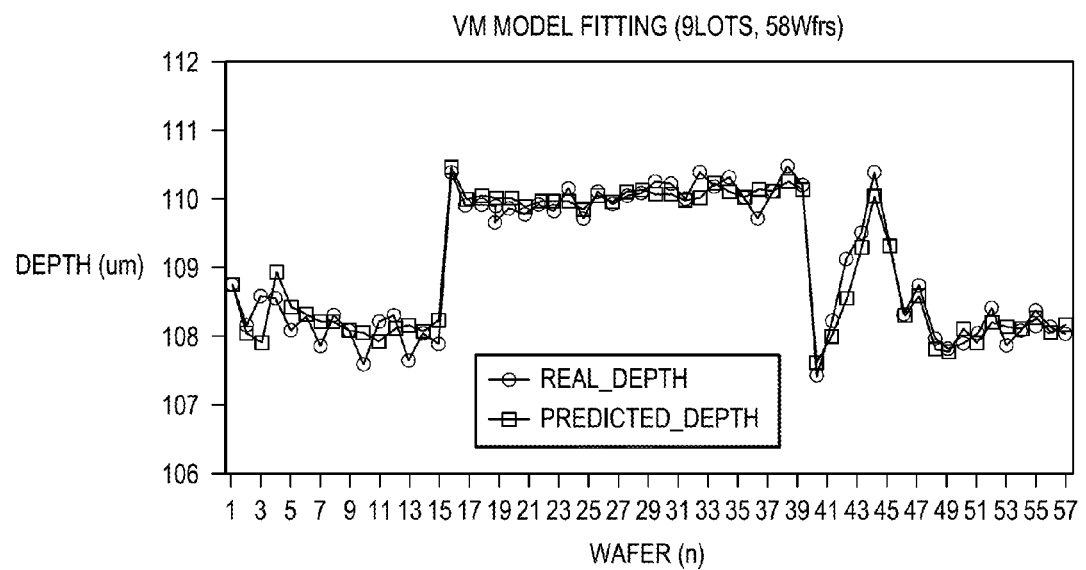
FIG. 6 depicts in a plot the fit for an embodiment model.

FIG. 6 illustrates in a graph the fit of the virtual metrology model for an example RIE etch process plotted against real measured via depth, for a sample of 58 wafers. The data is plotted as depth in microns on the vertical axis, and the wafer sample number is plotted on the horizontal axis. As can be seen from FIG. 6, the estimated depths obtained by executing the virtual metrology model are very close to the real via depths. The real depth for each wafer is plotted as the open square points, while the predicted depth for each wafer obtained by the virtual metrology model of the method embodiments is plotted as the filled squares. The model closely predicts the actual results, making reliable end point detection for the RIE process feasible.

Various studies of the key performance indicators ("KPIs") for the virtual metrology model used in the example of the RIE process have been done. The model yields excellent fit results. For the 58 wafer sample, the metrics were R-square ("R2")=95%, root mean squared error ("RMSE") of 0.24 ums, an average predicted error of 0.17 ums, and the maximum predicted error of 0.65 ums; for a target via depth of 109 ums. By any KPI measure the model of the embodiments provides an excellent estimate of actual via depth obtained in the RIE process.

Figure 7:
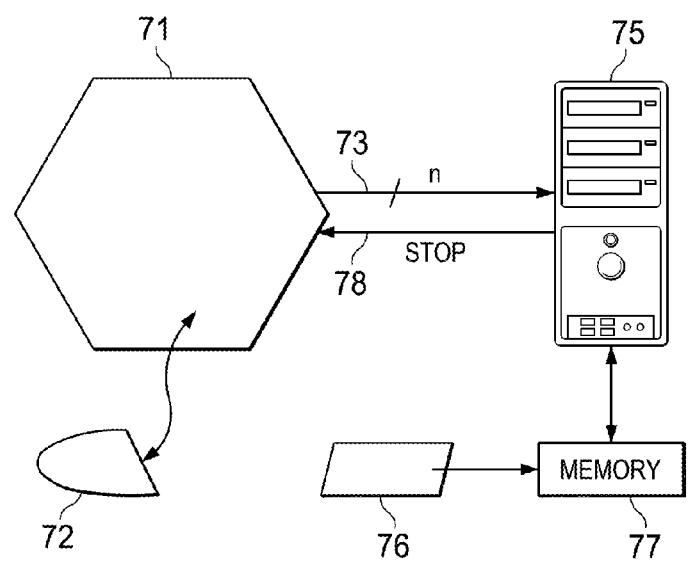
FIG. 7 depicts in a simple block diagram an apparatus embodiment.

An apparatus embodiment is illustrated in a simple block diagram in FIG. 7. In FIG. 7, a process tool 71 is depicted for processing wafers such as wafer 72. A plurality of real time in-situ parameter measures are output on signals 73. These may include, as non-limiting examples, pressure, temperature, RF energy, microwave energy, frequency, power, number of cycles, pH, or other measures of process parameters that are relevant to the process results. Computer or CPU 75 receives these real time in-situ measurements during processing. Computer 75 also retrieves a predetermined virtual metrology model 76 for the process from a memory 77 which may be a data or program store, such as a hard disk drive, memory device, flash card, or the model 76 may be received even from a remote location, such as a file retrieved over a network. CPU 75 then performs the method embodiment such as shown in FIG. 4, estimating the process results by executing the virtual metrology model, using the received parametric measurements, in the iterative manner described above. A comparison may be done to a target result, for example, for an etch process as described above, a target via depth; and if the virtual metrology model indicates that the target is reached, the STOP signal 78 may be transmitted to the process tool.

The apparatus 71 in FIG. 7 may be, for example, any wafer process tool; including the example RIE etch process tool described above, where end point detection would be applicable. The CPU may be provided as part of the tool itself, or an external computer, work station, IC or other CPU can be used.

The embodiments are not limited to any particular substrate or via depths, via depths may be up to 200 microns or more using the RIE etch process described above, the methods are not limited to any particular process tool, or process node.

In an embodiment, a method is performed, receiving a wafer into an etch tool chamber for performing an RIE etch; beginning the RIE etch to form vias in the wafer; receiving in-situ measurements of one or more physical parameters of the etch tool chamber that are correlated to the RIE etch process; providing a virtual metrology model for the RIE etch in the chamber; inputting the received in-situ measurements to the virtual metrology model for the RIE etch in the chamber; executing the virtual metrology model to estimate the current via depth; comparing the estimated current via depth to a target depth; and when the comparing indicates the current via depth is within a predetermined threshold of the target depth; outputting a stop signal.

In another embodiment, a method begins by performing a plurality of RIE etch operations in an RIE chamber tool on a plurality of silicon wafers to form vias; during the plurality of RIE etch operations, collecting in-situ measurements of one or more physical parameters of the RIE chamber tool correlated to the resulting via depths; following the plurality of RIE etch operations, measuring the via depths obtained in the plurality of silicon wafers; performing a statistical analysis on the collected in-situ measurements and the measured via depths obtained, forming a virtual metrology model for the RIE etch operation in the RIE chamber tool; receiving a silicon wafer into the RIE chamber tool; beginning the RIE etch to form vias in the wafer; receiving in-situ measurements of one or more physical parameters of the etch tool chamber that are correlated to the depth of the vias in the RIE etch process; inputting the received in-situ measurements to the virtual metrology model for the RIE etch in the chamber; executing the virtual metrology model to estimate the current via depth; comparing the estimated current via depth to a target depth; and when the comparing indicates the current via depth is within a predetermined threshold of the target depth; outputting a stop signal.

In yet another embodiment, an apparatus is provided, comprising a reactive ion etch chamber tool having outputs for signaling in-situ measurements of physical parameters during etching of a silicon wafer; and having a stop input for receiving a signal indicating a stop for an etch process; a programmable processor for executing a virtual metrology model of the reactive ion etch chamber to estimate a via depth achieved during an etch process responsive to the in-situ measurements, and having an output for transmitting the stop signal when an estimated via depth determined by the virtual metrology model exceeds a predetermined threshold based on a target via depth; and a storage coupled to the programmable processor and storing the virtual metrology model of the reactive ion etch chamber.

The scope of the present application is not intended to be limited to the particular illustrative embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A method, comprising:
    receiving a wafer into an etch tool chamber for performing an RIE etch;
    beginning the RIE etch to form vias in the wafer;
    receiving in-situ measurements of one or more physical parameters of the etch tool chamber that are correlated to the RIE etch process;
    providing a virtual metrology model for the RIE etch in the chamber;
    inputting the received in-situ measurements to the virtual metrology model for the RIE etch in the chamber;
    executing the virtual metrology model to estimate the current via depth;
    comparing the estimated current via depth to a target depth; and
    when the comparing indicates the current via depth is within a predetermined threshold of the target depth; outputting a stop signal.

2. The method of claim 1, and further comprising:
    when the comparing indicates the current via depth is not within the predetermined threshold of the target depth, then iteratively repeating the receiving, inputting, executing and comparing while continuing the RIE etch processing until the comparing indicates the current via depth is within the predetermined threshold of the target depth.

3. The method of claim 1, wherein providing the virtual metrology model for the RIE etch process in the chamber comprises:
    for a plurality of wafer runs, collecting in-situ measurements for the one or more physical parameters of the etch tool chamber that are correlated to the depth of the vias;
    following the RIE etch process for the plurality of wafer runs, determining the actual via etch depth achieved for each of the plurality of wafer runs;
    performing statistical modeling of the physical parameter measurements to form the virtual metrology model for the RIE etch process; and
    storing the virtual metrology model.

4. The method of claim 3, wherein the step of performing statistical modeling further comprises performing Fourier transforms on the measurements of the physical parameters.

5. The method of claim 4, wherein the step of performing statistical modeling further comprises using a hybrid statistical model to form the virtual metrology model.

6. The method of claim 1, wherein executing the virtual metrology model further comprises performing instructions that implement the virtual metrology model on a programmable computer having a stored version of the virtual metrology model; and inputting the received in-situ measurements to the virtual metrology model.

7. The method of claim 1, and further comprising:
    after outputting the stop signal, stopping the RIE etch process; and
    performing a subsequent over etch on the vias on the wafer to further shape the vias.

8. The method of claim 1, and further comprising:
    removing the wafer from the RIE etch tool;
    filling the vias with conductive material; and
    exposing the bottom of the vias in a backgrinding operation to form through silicon vias extending through the wafer.

9. A method, comprising:
    performing a plurality of RIE etch operations in an RIE chamber tool on a plurality of silicon wafers to form vias;
    during the plurality of RIE etch operations, collecting in-situ measurements of one or more physical parameters of the RIE chamber tool correlated to the resulting via depths;
    following the plurality of RIE etch operations, measuring the via depths obtained in the plurality of silicon wafers;
    performing a statistical analysis on the collected in-situ measurements and the measured via depths obtained, forming a virtual metrology model for the RIE etch operation in the RIE chamber tool;
    receiving a silicon wafer into the RIE chamber tool;
    beginning the RIE etch to form vias in the wafer;

receiving in-situ measurements of one or more physical parameters of the etch tool chamber that are correlated to the depth of the vias in the RIE etch process;

inputting the received in-situ measurements to the virtual metrology model for the RIE etch in the chamber;

executing the virtual metrology model to estimate the current via depth;

comparing the estimated current via depth to a target depth; and when the comparing indicates the current via depth is within a predetermined threshold of the target depth; outputting a stop signal.

10. The method of claim 9, and further comprising: subsequently performing an over etch in the RIE chamber at a lowered etch rate to further shape the vias.

11. The method of claim 9, wherein the forming a virtual metrology model comprises forming a hybrid statistical model.

12. The method of claim 11, wherein forming a virtual metrology model comprises forming a model that estimates the via depth Y as: $Y=0.0133x_1+0.1455x_2+0.0694x_3-0.0297x_4+\ldots+\in$; where $X_1$ is cycles, $X_2$ is the upper chamber temperature, $X_3$ is another chamber temperature, $x_4$ is the TCP RF frequency interval, and c represents additional parameters.

13. The method of claim 9, and further comprising:
removing the silicon wafer from the RIE chamber tool;
performing a via filling process to fill the vias with a conductor material;
mounting integrated circuits on a die side of the silicon wafer;
performing a backgrinding operation on a back side of the silicon wafer, opposite the die side; and
exposing the vias on the back side to form through silicon vias.

14. The method of claim 13, wherein the integrated circuits are flip chip mounted on the die side of the silicon wafer.

15. The method of claim 14, and further comprising forming solder connectors on the back side of the silicon wafer, at least one of the solder connectors being coupled to a corresponding one of the through silicon vias.

* * * * *

UNITED STATES PATENT AND TRADEMARK OFFICE
CERTIFICATE OF CORRECTION

PATENT NO. : 8,445,296 B2  
APPLICATION NO. : 13/189287  
DATED : May 21, 2013  
INVENTOR(S) : Wang et al.

Page 1 of 1

It is certified that error appears in the above-identified patent and that said Letters Patent is hereby corrected as shown below:

In the Claims:

In Col. 10, line 3, claim 12, delete "c" and insert --ε--.

Signed and Sealed this
Sixteenth Day of July, 2013

Teresa Stanek Rea
*Acting Director of the United States Patent and Trademark Office*